(12) United States Patent
Matsumoto et al.

(10) Patent No.: US 10,533,873 B2
(45) Date of Patent: Jan. 14, 2020

(54) INFORMATION COMMUNICATION SYSTEM FOR VEHICLE

(71) Applicant: MAZDA MOTOR CORPORATION, Hiroshima (JP)

(72) Inventors: Seiji Matsumoto, Hiroshima (JP); Natsuko Miyadera, Hiroshima (JP); Hiroyuki Yoshida, Hiroshima (JP)

(73) Assignee: MAZDA MOTOR CORPORATION, Hiroshima (JP)

( * ) Notice: Subject to any disclaimer, the term of this patent is extended or adjusted under 35 U.S.C. 154(b) by 36 days.

(21) Appl. No.: 15/580,621

(22) PCT Filed: Jun. 13, 2016

(86) PCT No.: PCT/JP2016/002840
§ 371 (c)(1),
(2) Date: Dec. 7, 2017

(87) PCT Pub. No.: WO2016/203754
PCT Pub. Date: Dec. 22, 2016

(65) Prior Publication Data
US 2018/0172471 A1    Jun. 21, 2018

(30) Foreign Application Priority Data

Jun. 17, 2015  (JP) .................................. 2015-122181

(51) Int. Cl.
*G01C 21/36* (2006.01)
*G01R 31/382* (2019.01)
(Continued)

(52) U.S. Cl.
CPC ....... *G01C 21/3688* (2013.01); *G01M 17/007* (2013.01); *G01R 31/382* (2019.01); *H04L 67/12* (2013.01)

(58) Field of Classification Search
None
See application file for complete search history.

(56) References Cited

U.S. PATENT DOCUMENTS

| 8,842,615 B1* | 9/2014 | Kalbag | H04W 72/0486 370/329 |
| 2004/0064227 A1* | 4/2004 | Chinnadurai | G01N 35/00871 701/31.4 |

(Continued)

FOREIGN PATENT DOCUMENTS

| EP | 2107531 A1 | 10/2009 |
| JP | 2003-178396 A | 6/2003 |

(Continued)

OTHER PUBLICATIONS

International Search Report issued in PCT/JP2016/002840; dated Aug. 23, 2016.

(Continued)

*Primary Examiner* — Nicholas K Wiltey
(74) *Attorney, Agent, or Firm* — Studebaker & Brackett PC

(57) ABSTRACT

An information communications system (100) for a vehicle includes an on-vehicle information device (10). The on-vehicle information device (10) includes: an information collection unit (11) which collects vehicle information from an on-vehicle device (41, 42, 43, 44), communication interfaces (14A, 14B) connected to mobile terminals (20) having a communication function and being brought inside the vehicle, and a control unit (12) which transfers the vehicle information collected by the information collection unit (11) to any one of the mobile terminals (20) via any one of the communication interfaces (14A, 14B). If one of the mobile terminals (20) currently selected as a destination of the vehicle information satisfies a predetermined condition, the control unit (12) switches the destination of the vehicle (Continued)

information to a different mobile terminal (20). The mobile terminal (20) which received the vehicle information transfers the vehicle information thus received to a center device (30).

15 Claims, 7 Drawing Sheets

(51) Int. Cl.
*G01M 17/007* (2006.01)
*H04L 29/08* (2006.01)

(56) References Cited

U.S. PATENT DOCUMENTS

| | | | | |
|---|---|---|---|---|
| 2007/0156313 | A1* | 7/2007 | Fudali | G07C 5/008 701/31.4 |
| 2008/0091342 | A1* | 4/2008 | Assael | G01C 21/3438 701/533 |
| 2008/0119981 | A1* | 5/2008 | Chen | G05B 23/0267 701/31.4 |
| 2009/0265057 | A1* | 10/2009 | Chinnadurai | G07C 5/085 701/31.4 |
| 2009/0276115 | A1* | 11/2009 | Chen | G07C 5/008 701/29.6 |
| 2009/0307188 | A1* | 12/2009 | Oldham | G06F 3/0482 |
| 2010/0042288 | A1* | 2/2010 | Lipscomb | G07C 5/0808 701/31.4 |
| 2010/0153279 | A1* | 6/2010 | Zahn | G06Q 10/02 705/80 |
| 2011/0141953 | A1* | 6/2011 | Wright | H04L 63/123 370/310 |
| 2011/0145089 | A1* | 6/2011 | Khunger | G01C 21/3438 705/26.4 |
| 2011/0313593 | A1* | 12/2011 | Cohen | G01S 5/0027 701/2 |
| 2012/0044527 | A1* | 2/2012 | Panko | G07C 5/008 358/1.15 |
| 2012/0046807 | A1* | 2/2012 | Ruther | B60R 25/24 701/2 |
| 2012/0046824 | A1 | 2/2012 | Ruther et al. | |
| 2012/0046825 | A1* | 2/2012 | Ruther | G07C 5/008 701/31.5 |
| 2012/0046897 | A1* | 2/2012 | Panko | G01R 13/029 702/67 |
| 2012/0047289 | A1* | 2/2012 | Krzystofczyk | H04L 63/083 710/10 |
| 2012/0047291 | A1* | 2/2012 | Davis | G07C 5/0825 710/14 |
| 2012/0047499 | A1* | 2/2012 | Krzystofczyk | G06F 8/63 717/174 |
| 2012/0188132 | A1 | 7/2012 | Peulecke et al. | |
| 2012/0253654 | A1* | 10/2012 | Sun | G06Q 10/02 701/409 |
| 2013/0331108 | A1 | 12/2013 | Otomo et al. | |
| 2015/0161564 | A1* | 6/2015 | Sweeney | G06Q 10/063114 705/338 |
| 2015/0254581 | A1* | 9/2015 | Brahme | G06Q 10/02 705/5 |
| 2015/0377635 | A1* | 12/2015 | Beaurepaire | G01C 21/3423 701/408 |
| 2016/0314627 | A1* | 10/2016 | Fish | G07C 5/008 |
| 2017/0054948 | A1* | 2/2017 | Angel | G06F 16/7867 |
| 2018/0039917 | A1* | 2/2018 | Buttolo | G01C 21/3438 |
| 2018/0238694 | A1* | 8/2018 | Bellotti | G01C 21/3438 |
| 2018/0257498 | A1* | 9/2018 | Delp | G05D 1/0225 |
| 2018/0342035 | A1* | 11/2018 | Sweeney | G05D 1/0088 |

FOREIGN PATENT DOCUMENTS

| | | |
|---|---|---|
| JP | 2006-025048 A | 1/2006 |
| JP | 2007-214756 A | 8/2007 |
| JP | 2010-199717 A | 9/2010 |
| JP | 2011-076322 A | 4/2011 |
| JP | 2012-175529 A | 9/2012 |
| KR | 2013-0030583 A | 3/2013 |
| RU | 2221277 C1 | 1/2004 |
| RU | 2011151949 A | 6/2013 |
| WO | 2012/108057 A1 | 8/2012 |

OTHER PUBLICATIONS

An Extended European Search Report dated May 9, 2018, which corresponds to European Patent Application No. 16811229.0 and is related to U.S. Appl. No. 15/580,621.

* cited by examiner

INFORMATION COMMUNICATION SYSTEM FOR VEHICLE

TECHNICAL FIELD

The present invention relates to an information communications system for a vehicle, the system transmitting vehicle information to an external destination.

BACKGROUND ART

Various kinds of electronic control units (ECU) for various kinds of control, such as powertrain control, body control, and vehicle control, are mounted on a vehicle, such as a passenger car. In addition, an operation data recorder (ODR) is sometimes mounted on the vehicle to record various operating situations of the vehicle. Various kinds of vehicle-related information (will be hereinafter referred to as "vehicle information") collected from these on-vehicle devices are useful for diagnosis of vehicle failure, or maintenance of the vehicle.

The vehicle information is accumulated, analyzed, and processed in an external device such as a center device. To allow the center device to get the vehicle information, it is necessary to write the vehicle information into a memory device (e.g., a USB memory), connect the USB memory to a PC, and transmit the vehicle information to the center device via the Internet. This imposes a significant inconvenience. To eliminate such inconvenience, it has been known that an exclusive communication module or cellular phone for bidirectional communication is used to transmit diagnostic information of a traveling vehicle to a center device (see, e.g., Patent Document 1).

CITATION LIST

Patent Documents

Patent Document 1: Japanese Unexamined Patent Publication No. 2006-25048

SUMMARY

Technical Problem

As compared with the above-described known technology of mounting on a vehicle a communication module exclusive for transmission of the vehicle information, it is more cost-effective and suitable to use a mobile terminal owned by a passenger, such as a smartphone or a tablet, as a transmitter for transmitting the vehicle information. However, the mobile terminal is not exclusive for the transmission of the vehicle information. Thus, to use the mobile terminal as the vehicle information transmitter, circumstances specific to the mobile terminal needs to be taken into account.

In view of the foregoing background, it is therefore an object of the present invention to provide an information communications system for a vehicle suitable for a situation in which a mobile terminal such as a cellular phone or a smartphone is used as a transmitter for transmitting vehicle information.

Solution to the Problem

In an aspect of the present invention, disclosed is an information communications system for a vehicle, the system including an on-vehicle information device. The on-vehicle information device includes: an information collection unit which collects vehicle information from an on-vehicle device; a plurality of communication interfaces connected to a plurality of mobile terminals having a communication function and being brought inside the vehicle; and a control unit which transfers the vehicle information collected by the information collection unit to any one of the plurality of mobile terminals via any one of the plurality of communication interfaces. If one of the mobile terminals currently selected as a destination of the vehicle information satisfies a predetermined condition, the control unit switches the destination of the vehicle information to a different mobile terminal, and the mobile terminal which received the vehicle information transfers the vehicle information thus received to a center device.

Advantages of the Invention

According to the present invention, in the field of an information communications system for a vehicle, the system transmitting vehicle information to an external destination, a mobile terminal such as a cellular phone and a smartphone can be suitably used as a transmitter.

DESCRIPTION OF EMBODIMENTS

Embodiments will be described hereinafter in detail with reference to the drawings. Note that more-than-necessary descriptions may sometimes be omitted. For example, a detailed description of well-known issues, and a repetitive description of substantially the same structures may sometimes be omitted. This is to keep the following descriptions from being unnecessarily redundant, and help those skilled in the art understand the descriptions.

Note that the attached drawings and the following descriptions are provided by the inventors to help those skilled in the art thoroughly understand the present invention, not to intend to limit the subject matter recited in the claims.

Figure 1:
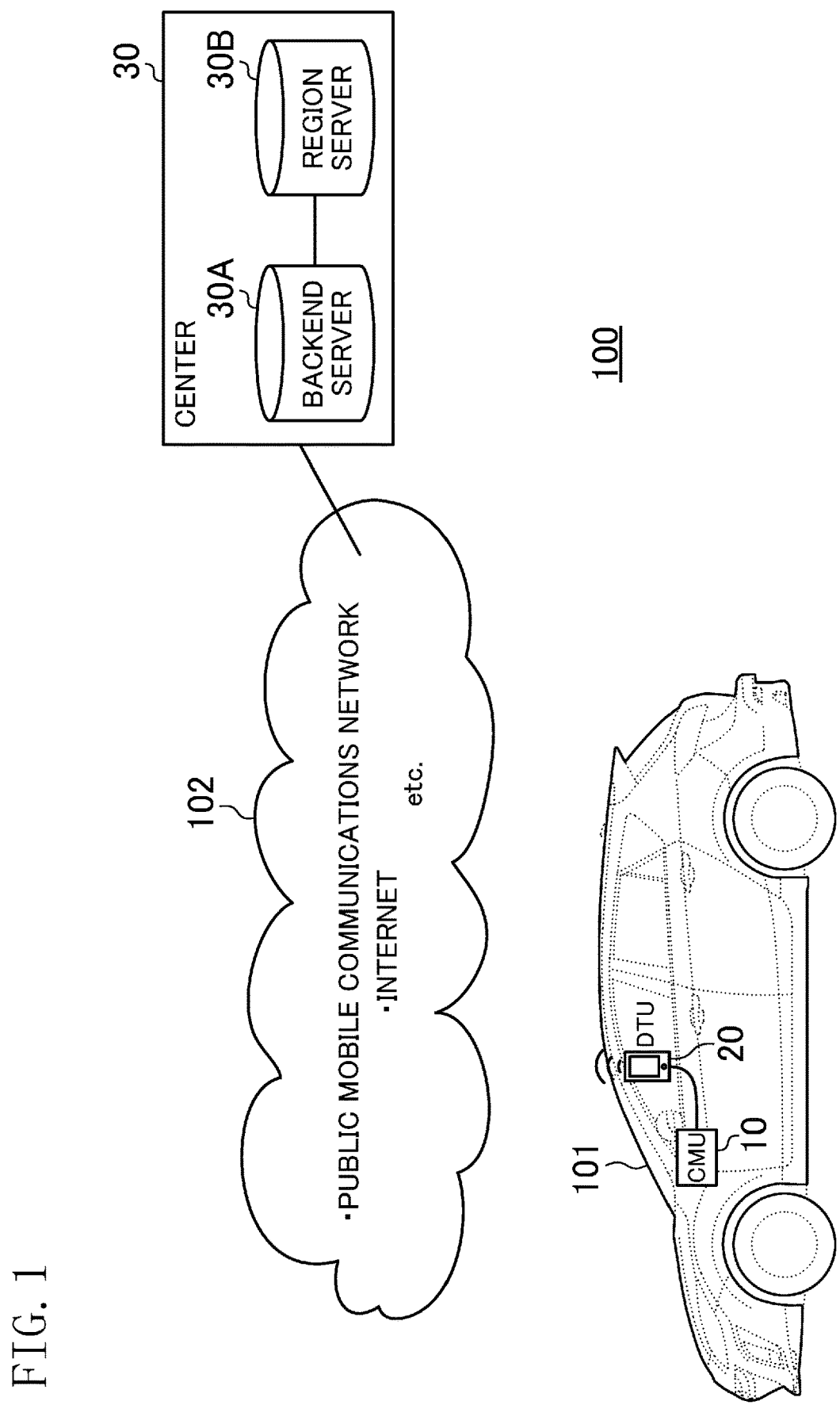
FIG. 1 schematically illustrates an information communications system for a vehicle according to an embodiment.

FIG. 1 schematically illustrates an information communications system for a vehicle according to an embodiment. An information communications system 100 for a vehicle according to this embodiment includes an on-vehicle information device (connectivity master unit: CMU) 10, a mobile terminal (data transfer unit: DTU) 20, and a center device 30. Among them, the on-vehicle information device 10 and the mobile terminal 20 are disposed inside a vehicle 101, while the center device 30 is disposed outside the vehicle (at a remote location).

The vehicle 101 is an automobile, typically a passenger car, which is driven by power generated by a motor such as an internal combustion engine, a hybrid engine, or an electric motor.

The on-vehicle information device 10 is an on-vehicle device mounted on a dashboard or a center console of the vehicle 101. The on-vehicle information device 10 includes a small display (not shown) with a touch panel function. Thus, with a touch of the display, a user is allowed to operate a car navigation system, an on-vehicle AV device, and an air conditioner in a cabin, and control various settings of the vehicle.

The on-vehicle information device 10 also has the function of collecting vehicle information of the vehicle 101. The "vehicle information" used herein includes various kinds of information obtained from various on-vehicle devices mounted on the vehicle 101. Examples of the vehicle information include raw data originally detected by the on-vehicle devices (e.g., global positioning system (GPS) information and time information), data analyzed and processed by the on-vehicle devices (e.g., data of heater control analysis and data of brake analysis).

The mobile terminal 20 is a mobile information terminal or a mobile communication device, such as a cellular phone, a smartphone, a tablet, and a notebook computer. The mobile terminal 20 is brought inside a cabin of the vehicle 101 and connected by wire and/or wirelessly to the on-vehicle information device 10. As will be described later, two or more mobile terminals 20 may be connected simultaneously to the on-vehicle information device 10. Further, two communication interfaces, one of which is wired and the other is wireless, are available to a single mobile terminal 20 for connection to the on-vehicle information device 10. The mobile terminal 20 connected to the on-vehicle information device 10 allows a passenger to operate the mobile terminal 20 via the on-vehicle information device 10. For example, a passenger can play a music and/or video content stored in the mobile terminal 20, or a radio program received via the mobile terminal 20, on the on-vehicle AV device by operating the on-vehicle information device 10. Alternatively, a passenger can check a short message on the on-vehicle information device 10, or can talk hands-free via the on-vehicle information device 10.

The mobile terminal 20 is capable of communicating via a network supplied by a telecommunications carrier, such as 3G, long term evolution (LTE), or global system for mobile communication (GSM). When an exclusive application is activated on the mobile terminal 20, the mobile terminal 20 functions as a transmitter for wirelessly transferring vehicle information received from the on-vehicle information device 10 to the center device 30 via a telecommunications line 102.

The telecommunications line 102 includes, for example, a public mobile communications network supplied by a telecommunications carrier, such as 3G, LTE and GSM, the Internet, a wide area network (WAN), and a local area network (LAN).

The center device 30 receives the vehicle information transferred from the mobile terminal 20 via the telecommunications line 102, and accumulates, analyzes, and processes the received vehicle information. For example, the center device 30 is comprised of a plurality of servers. A backend server 30A is disposed at a terminal end of the telecommunications line 102. The backend server 30A mainly functions as a communication platform, and receives and accumulates the vehicle information transferred from the mobile terminal 20. The backend server 30A is connected to another server, such as a region server 30B, via WAN, LAN or any other suitable network. The region server 30B reads, analyzes, and processes information accumulated in the backend server 30A as needed. The information analyzed and processed by the region server 30B is used for maintenance of the vehicle 101, or supply of high-value-added services.

As can be seen from the foregoing, according to the information communications system 100 for a vehicle of this embodiment, the vehicle information is transferred to the center device 30 using a general-purpose mobile terminal, such as a smartphone, owned by a passenger of the vehicle 101, in place of an exclusive communication device mounted on the vehicle 101.

Figure 2:
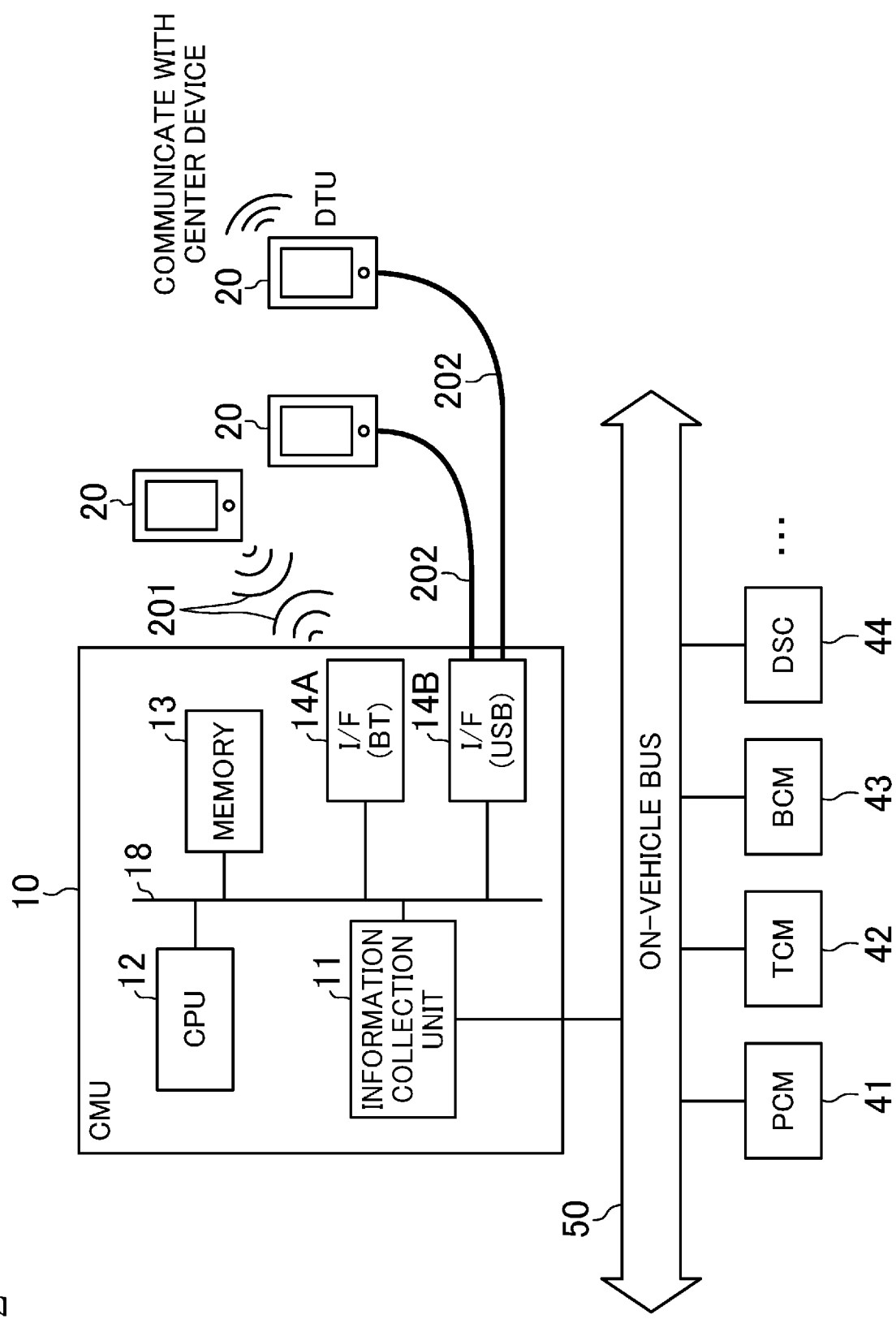
FIG. 2 illustrates an example of a configuration of an on-vehicle system.

An exemplary configuration of an on-vehicle system of the vehicle 101 will be described below. FIG. 2 shows an exemplary configuration of an on-vehicle system.

The vehicle 101 is equipped with various electronic control modules (ECM). Examples of the ECM include: a powertrain control module (PCM) 41 for controlling the operation of a powertrain including an engine; a transmission control module (TCM) 42 for controlling a transmission; a body control module (BCM) 43 for controlling electrical components such as wipers, door locks, interior lights, blinkers, taillights, a keyless entry system, and a security system; and a dynamic stability control (DSC) 44 for controlling an engine torque to prevent wheel slip and maintain running stability of the vehicle. These on-vehicle devices are connected to an on-vehicle bus 50 such as a controller area network (CAN).

The on-vehicle information device 10 is also connected to the on-vehicle bus 50. Specifically, the on-vehicle information device 10 includes an information collection unit 11, a central processing unit (CPU) 12, a memory 13, and communication interfaces (I/F) 14A and 14B. These components are connected to an internal bus 18.

The information collection unit 11 is a module which collects the vehicle information from the above-listed on-vehicle devices. The information collection unit 11 is connected to the on-vehicle bus 50 via an interface for connection to the on-vehicle bus 50, such as a CAN bus interface.

The memory 13 includes a volatile memory such as a dynamic random access memory (DRAM) and a static random access memory (SRAM), and a nonvolatile memory such as a read only memory (ROM) and a flash memory. The memory 13 can store programs for operating the on-vehicle information device 10 (if the memory 13 is a ROM or a flash memory), temporarily store the vehicle information collected by the information collection unit 11 (if the memory 13 is a RAM), or accumulate the vehicle information for a long time (if the memory 13 is a flash memory).

The communication interfaces 14A and 14B connect the on-vehicle information device 10 and the mobile terminal 20 to each other. The communication interface 14A is a short-range wireless communication interface such as Bluetooth®, and communicates with the on-vehicle information device 10 and the mobile terminal 20 via wireless communication 201. The communication interface 14B is a wired interface such as a universal serial bus (USB), and is connected to, and communicates with, the on-vehicle information device 10 and the mobile terminal 20 via a cable 202.

A plurality of mobile terminals 20 can be connected simultaneously to the on-vehicle information device 10 through both of the communication interfaces 14A and 14B. In particular, the communication interface 14B has plural ports, to which a plurality of mobile terminals 20 can be connected simultaneously. In an example shown in FIG. 2, the communication interface 14B has two ports. Thus, up to three mobile terminals 20 can be connected simultaneously to the communication interfaces 14A and 14B.

Figure 3:
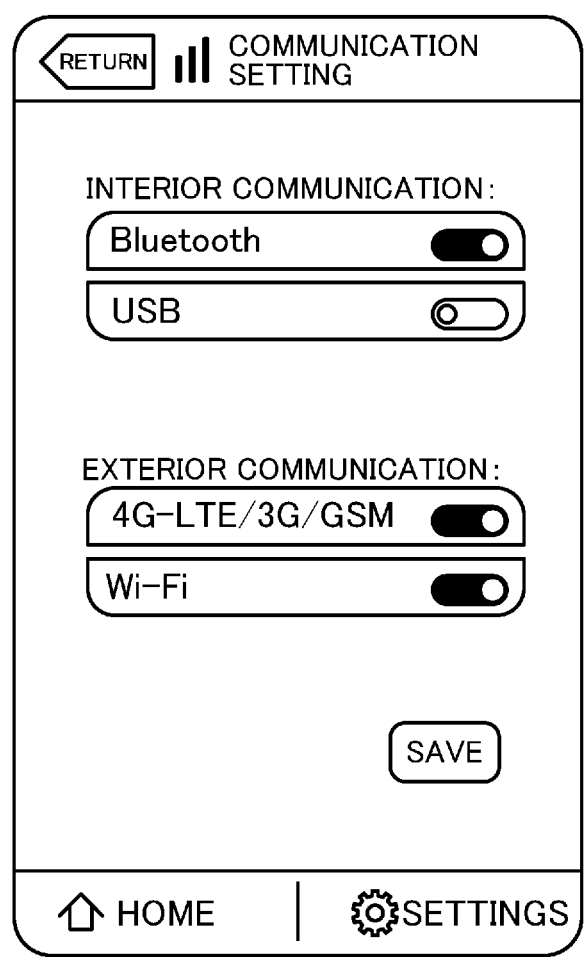
FIG. 3 illustrates an environment configuration screen for setting interior and exterior communications of a mobile terminal.

In order to use the mobile terminal 20 as a transmitter for transmitting the vehicle information from the on-vehicle information device 10 to the center device 30, a user (passenger) is allowed to voluntarily set a communication environment inside and outside the vehicle related to the communication of the vehicle information. FIG. 3 shows an environment configuration screen for setting interior and exterior communications of the mobile terminal 20. As an example of the setting of the interior communications, a user can enable the Bluetooth and the USB separately. Further, as an example of the setting of the exterior communications, a user can enable carrier communications and Wi-Fi communications separately.

Referring back to FIG. 2, the CPU 12 controls general operation of the on-vehicle information device 10 in accordance with programs stored in the memory 13. For example, the CPU 12 analyzes and processes the vehicle information, collected from the on-vehicle device by the information collection unit 11, as needed, thereby generating an electronic file having a predetermined data structure. The electronic file thus generated is stored in the memory 13.

The CPU 12 generates a plurality of electronic files depending on the kind of information. For example, the CPU 12 may generate: a file containing accumulative data of distance traveled and fuel consumption (will be referred to as "file A" for convenience); a file containing traveling time, distance traveled, and fuel consumption during a single ride (a period from when ignition is turned on to when it is turned off), and a place and time where the ignition is turned off (will be referred to as "file B" for convenience); a file containing information about the ON/OFF states of warning lamps, a vehicle failure code, and information about the state of the vehicle for several seconds before and after a warning lamp has turned on (will be referred to as "file C" for convenience); and a file containing information about the ON/OFF states of indicator lamps, and information about the state of the vehicle for several seconds before and after an indicator lamp has turned on (will be referred to as "file D" for convenience). The timing when the file is generated depends on the kind of files. For example, the files A and B are generated when the ignition is turned off, the file C is generated when the warning lamp is lit, and the file D is generated when a safety device such as an antilock brake system (ABS) is activated.

Moreover, the CPU 12 reads the file from the memory 13 at predetermined timing, and transfers the read file to the mobile terminal 20 via one of the communication interfaces 14A and 14B which has been enabled through the communication environment setting. The mobile terminal 20 transfers the received file to the center device 30 via the telecommunications line 102. The timing when the CPU 12 reads and transmits the file varies depending on the kind of files. For example, the file A is read and transmitted when the engine is started, and the files B, C, and D are read and transmitted immediately after they are generated.

Figure 4:
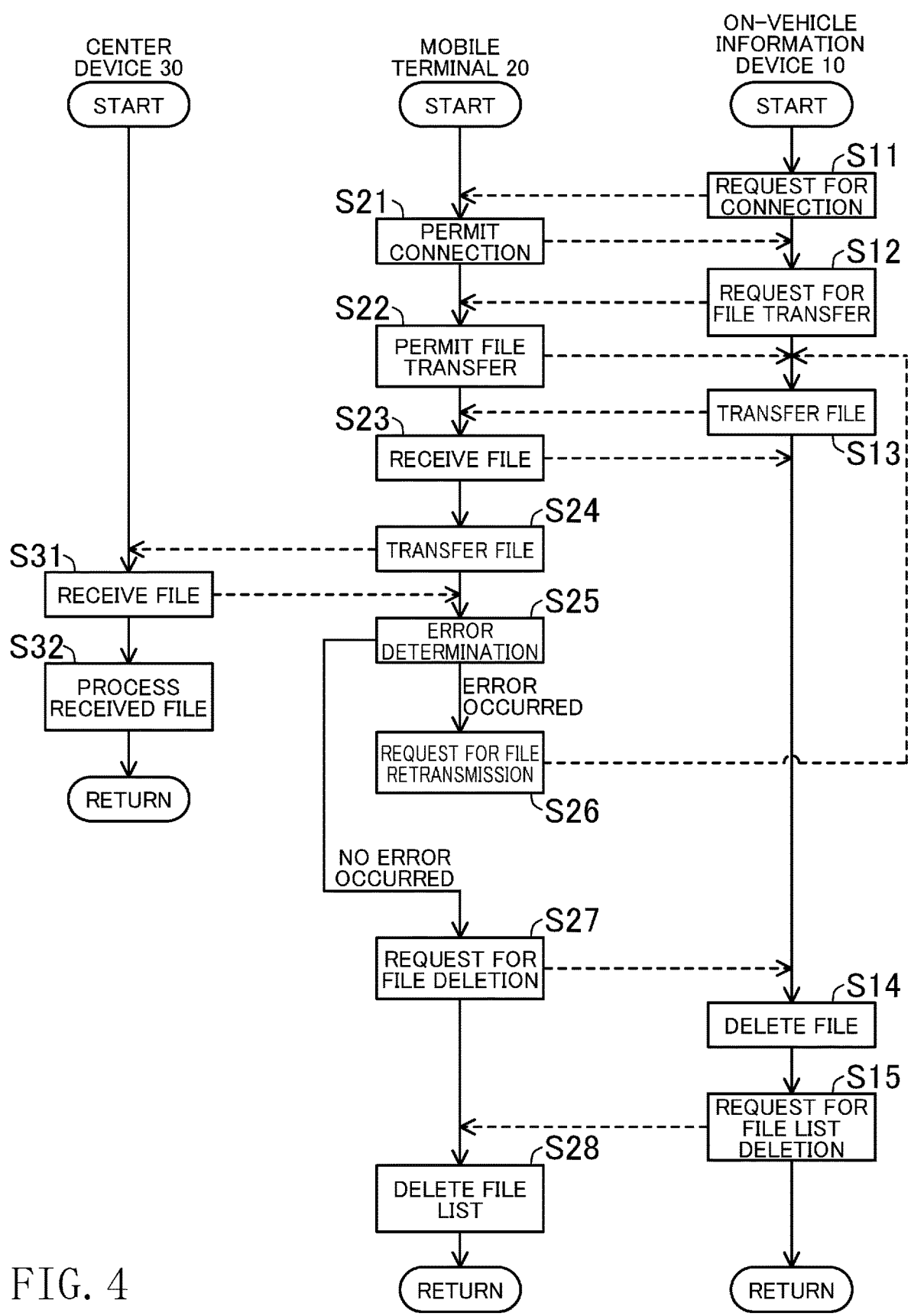
FIG. 4 illustrates a sequence diagram illustrating how vehicle information is transferred among an on-vehicle information device, a mobile terminal, and a center device.

FIG. 4 shows a sequence diagram illustrating how the vehicle information is transferred among the on-vehicle information device 10, the mobile terminal 20, and the center device 30. Referring to FIG. 4, it will be described how the vehicle information is transferred among the on-vehicle information device 10, the mobile terminal 20, and the center device 30. Note that the mobile terminal 20 is connected to the communication interface 14A or 14B and allowed to communicate with the on-vehicle information device 10, and with the center device 30 via the telecommunications line 102.

If the on-vehicle information device 10 has generated a file containing the vehicle information and a trigger for transmitting the file to the center device 30 has been generated, the on-vehicle information device 10 requests the mobile terminal 20 for connection (step S11). Receiving the request for connection, the mobile terminal 20 checks whether the mobile terminal itself is ready for connection with the on-vehicle information device 10. Then, the mobile terminal 20, if it is ready for connection, gives the on-vehicle information device 10 permission for connection (step S21).

Receiving the permission for connection, the on-vehicle information device 10 requests the mobile terminal 20 for file transfer (step S12). Receiving the request for file transfer, the mobile terminal 20 gives the on-vehicle information device 10 permission for file transfer (step S22). Receiving the permission for file transfer, the on-vehicle information device 10 transfers the file containing the vehicle information to the mobile terminal 20 via the communication interface 14A or 14B (step S13).

The mobile terminal 20 receives the file from the on-vehicle information device 10, and informs the on-vehicle information device 10 the result of reception (step S23). Subsequently, the mobile terminal 20 transfers the received file to the center device 30 via the telecommunications line 102 (step S24).

The center device 30 receives the file from the mobile terminal 20, and informs the mobile terminal 20 the result of reception (step S31). The mobile terminal 20 performs an error determination process, i.e., determines whether or not the file has been transferred to the center device 30 based on the result of reception informed by the center device 30 (step S25).

If the file transfer to the center device 30 has failed, the mobile terminal 20 requests the on-vehicle information device 10 to retransmit the file (step S26). Receiving the request for retransmission, the on-vehicle information device 10 transfers the file containing the vehicle information again to the mobile terminal 20 via the communication interface 14A or 14B (step S13).

If the file transfer to the center device 30 has succeeded, the center device 30 accumulates, analyzes and processes, the vehicle information contained in the file thus received (step S32). Then, the mobile terminal 20 requests the on-vehicle information device 10 to delete the file that has been successfully transferred (step S27).

Receiving the request for deletion, the on-vehicle information device 10 deletes the file that has been successfully transferred to the center device 30 via the mobile terminal 20 (step S14). Subsequently, the on-vehicle information device 10 requests the mobile terminal 20 to delete the file that has been successfully transferred from a file list (step S15).

The mobile terminal 20 has a file list to manage the files received from the on-vehicle information device 10 and to be transferred to the center device 30. Receiving the request for deletion, the mobile terminal 20 deletes the name of the file that has been transferred to the center device 30 from the file list (step S28). Use of the file list allows the mobile terminal 20 to keep track of whether the file transferred to the center device 30 has been deleted from the memory 13 of the on-vehicle information device 10.

According to the above-described procedures, the mobile terminal 20, such as a cellular phone, a smartphone, a tablet, or a notebook computer, brought into the cabin of the vehicle 101 by the passenger is allowed to function as a transmitter for transmitting the vehicle information from the on-vehicle information device 10 to the center device 30.

To use the mobile terminal 20 as the vehicle information transmitter, circumstances specific to the mobile terminal needs to be taken into account. For example, the mobile terminal 20 may encounter the following situations.

1. The battery of the mobile terminal 20 is running low.
2. The mobile terminal 20 is playing on an on-vehicle AV device a music or video content stored therein, thereby increasing a communication load between the on-vehicle information device 10 and the mobile terminal 20.
3. The reception from the telecommunications carrier is weak, and the mobile terminal 20 cannot connect to the telecommunications line 102.
4. The communication environment setting of the mobile terminal 20 does not allow the transfer of the vehicle information from the on-vehicle information device 10 to the mobile terminal 20.

In case of such situations, use of the mobile terminal 20 as the vehicle information transmitter is restricted to give higher priority to the original use of the mobile terminal 20 (situations 1 and 2), or use of the mobile terminal 20 as the transmitter is not allowed (situations 3 and 4). That is, the mobile terminal 20 cannot always be used as the vehicle information transmitter, but can be used as the transmitter only when the mobile terminal 20 is not in these situations. If the mobile terminal 20 used as the vehicle information transmitter encountered the situation described above, the mobile terminal 20 would sometimes suddenly stop functioning as the transmitter. Further, it is difficult for the on-vehicle information device 10 to exactly predict when the mobile terminal 20 is allowed to function as the vehicle information transmitter.

Under these circumstances, according to the information communications system 100 for a vehicle of this embodiment, if any one of the above-described situations arises in a case where one of the plurality of mobile terminals 20 connected to the on-vehicle information device 10 is selected as the vehicle information transmitter or being used as the transmitter, a different mobile terminal 20 is selected as the transmitter to transmit the vehicle information to the center device 30.

It will be described in detail below a vehicle information transmission process performed by the information communications system 100 of this embodiment.

First Example

Figure 5:
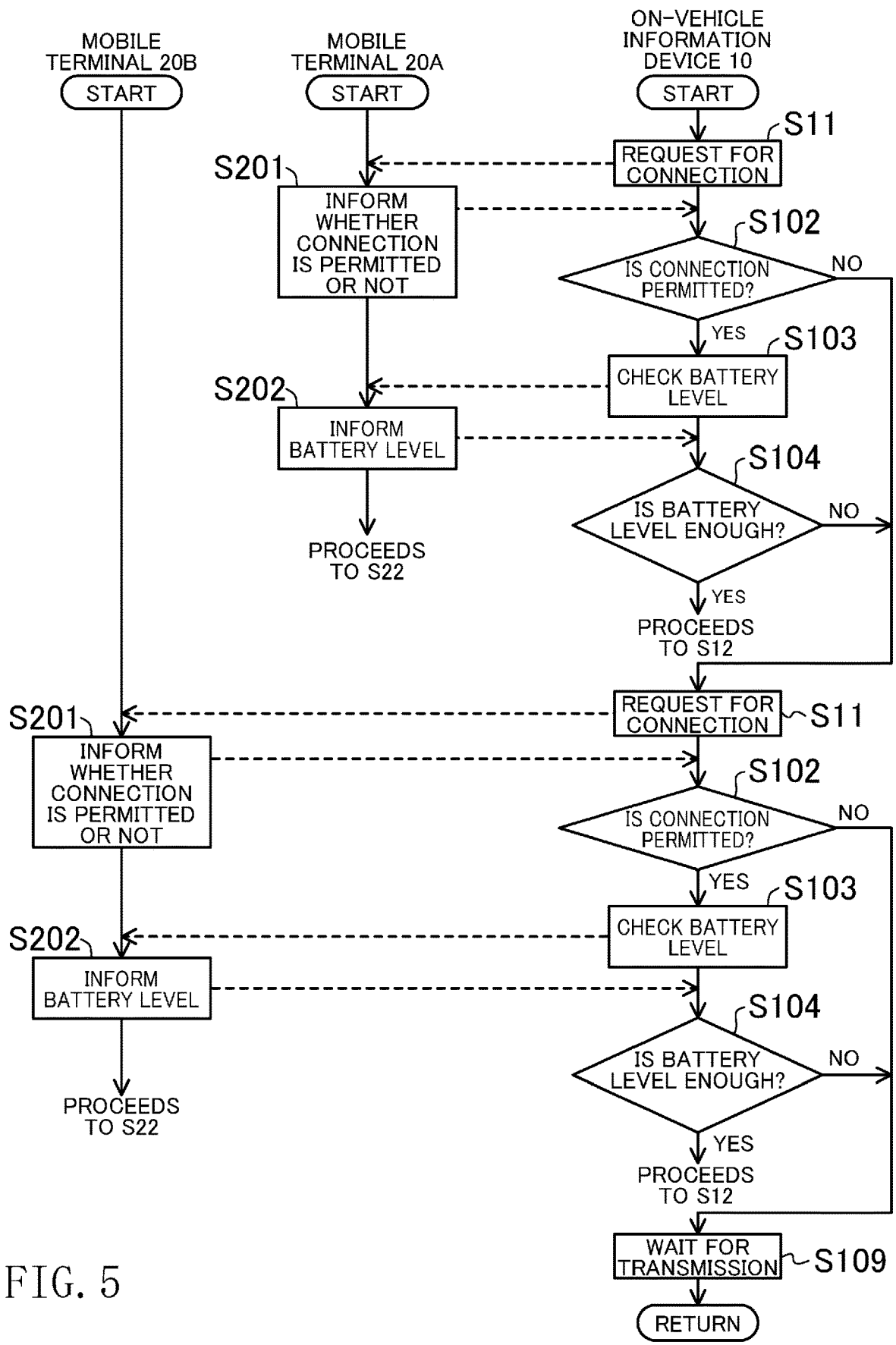
FIG. 5 illustrates an exemplary flowchart of a vehicle information transmission process performed by the information communications system.

FIG. 5 shows an exemplary flowchart of the vehicle information transmission process performed by the information communications system 100. Referring to FIG. 5, it will be described below an example of the vehicle information transmission process performed by the information communications system 100. For convenience, it is assumed that two mobile terminals 20 are connected to the on-vehicle information device 10. In FIG. 5, reference numerals 20A and 20B are shown to distinguish the two mobile terminals 20 from each other.

If the on-vehicle information device 10 has generated a file containing the vehicle information and a trigger for transmitting the file to the center device 30 has been generated, the on-vehicle information device 10 requests the mobile terminal 20A, which is currently selected as a destination, for connection (step S11). Receiving the request for connection, the mobile terminal 20A checks the communication environment setting to see the interior communications (see FIG. 3), and informs the on-vehicle information device 10 whether the connection is permitted or not (step S201).

For example, if, as an interior communication interface, Bluetooth is disabled and USB is enabled in a situation where the on-vehicle information device 10 and the mobile terminal 20A are connected via the communication interface 14A (Bluetooth) only, the mobile terminal 20A cannot be used as the vehicle information transmitter. Further, if, as the interior communication interface, Bluetooth is enabled and USB is disabled in a situation where the on-vehicle information device 10 and the mobile terminal 20A are connected via the communication interface 14B (USB) only, the mobile terminal 20A cannot be used as the vehicle information transmitter. In this way, determination of whether the connection to the on-vehicle information device 10 is permitted or not is made with high priority given to the communication environment setting.

Receiving permission for connection (the answer is YES in step S102), the CPU 12 of the on-vehicle information device 10 checks the battery level of the mobile terminal 20A (step S103). For example, the CPU 12 requests the mobile terminal 20A to notify the CPU 12 of the battery level. Receiving the request for notification, the mobile terminal 20A checks the battery level and notifies the on-vehicle information device 10 of it (step S202), and waits for the request for file transfer from the on-vehicle information device 10 (proceeds to step S22 in FIG. 4). The battery level may be, for example, expressed as a percentage of a charge level with respect to a battery capacity.

Receiving the notification of the battery level from the mobile terminal 20A, the CPU 12 determines whether the battery level of the mobile terminal 20A is enough or not. If the battery level is enough (the answer is YES in step S104), the CPU 12 requests the mobile terminal 20A for file transfer (proceeds to step S12 in FIG. 4). The battery level of the mobile terminal 20A may be determined, for example, by comparison between a percentage and threshold value of the battery level.

If the connection is refused by the mobile terminal 20A (the answer is NO in step S102), or if it is determined that the battery level of the mobile terminal 20A is low (the answer is NO in step S104), the CPU 12 quits transmitting the vehicle information via the mobile terminal 20A, and switches the destination of the vehicle information to the other mobile terminal 20B. That is, the CPU 12 requests the mobile terminal 20B for connection (step S11). Receiving the request for connection, the mobile terminal 20B checks the communication environment setting to see the interior communications (see FIG. 3), and informs the on-vehicle information device 10 whether the connection is permitted or not (step S201). Subsequently, as in the case of the mobile terminal 20A, based on whether the connection to the mobile terminal 20B is permitted or not and the battery level of the mobile terminal 20B, the CPU 12 requests the mobile terminal 20B for file transfer if the mobile terminal 20B permits the connection and has a sufficient battery level (proceeds to steps S12 and S22 in FIG. 4).

Alternatively, if the connection is refused by the mobile terminal 20B (the answer is NO in step S102), or if it is determined that the battery level of the mobile terminal 20B is low (the answer is NO in step S104), the CPU 12 interrupts the file transfer process, and the on-vehicle information device 10 waits for the timing of file transfer (step S109). After a lapse of a predetermined time, or if a next trigger for the transmission of a file to the center device 30 is generated, the on-vehicle information device 10 requests the mobile terminal 20A for connection, and repeats the above-described procedure.

Note that Bluetooth is configured to inform a master device of the battery level of a slave device. Thus, when the on-vehicle information device 10 and the mobile terminal 20 are connected via Bluetooth, the CPU 12 can get the battery level of the mobile terminal 20 without requesting the mobile terminal 20 to inform the CPU 12 of the battery level. Therefore, steps S103 and S202 can be skipped.

In the above-described procedure, check of the battery level of the mobile terminal 20 (step S103) may be performed before requesting the mobile terminal 20 for connection (before step S11).

Second Example

Figure 6:
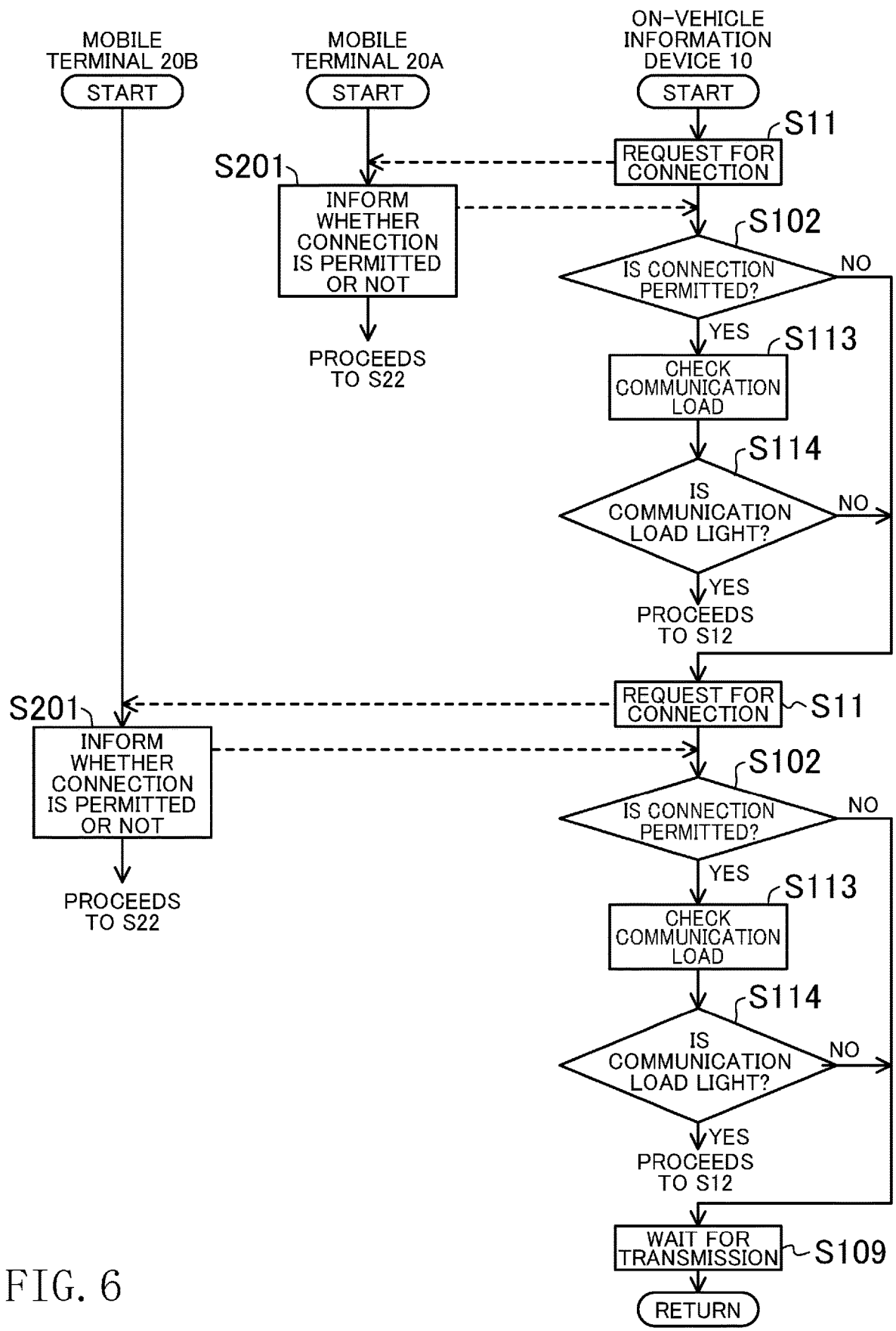
FIG. 6 illustrates another exemplary flowchart of a vehicle information transmission process performed by the information communications system.

FIG. 6 shows another exemplary flowchart of the vehicle information transmission process performed by the information communications system 100. Referring to FIG. 6, it will be described below another example of the vehicle information transmission process performed by the information communications system 100. For convenience, it is assumed that two mobile terminals 20 are connected to the on-vehicle information device 10. In FIG. 6, reference numerals 20A and 20B are shown to distinguish the two mobile terminals 20 from each other.

If the on-vehicle information device 10 has generated a file containing the vehicle information and a trigger for transmitting the file to the center device 30 has been generated, the on-vehicle information device 10 requests the mobile terminal 20A, which is currently selected as a destination, for connection (step S11). Receiving the request for connection, the mobile terminal 20A checks the communication environment setting to see the interior communications (see FIG. 3), and informs the on-vehicle information device 10 whether the connection is permitted or not (step S201).

Receiving permission for connection from the mobile terminal 20A (the answer is YES in step S102), the CPU 12 of the on-vehicle information device 10 checks a current communication load of one of the communication interfaces 14A and 14B which is permitted to be used for transfer of the vehicle information (step S113). Then, the CPU 12 determines whether the communication load is light or not. If the communication load is light (the answer is YES in step S114), the CPU 12 requests the mobile terminal 20A for file transfer (proceeds to step S12 in FIG. 4). Whether the communication load is light or not may be determined based on, for example, whether the on-vehicle information device 10 is playing, on an on-vehicle AV device, a music or video content received from the mobile terminal 20A when the CPU 12 is trying to transfer the file via the USB. Alternatively, when the CPU 12 is trying to transfer the file via Bluetooth, the communication load may be checked based on whether the passenger is talking hands-free via Bluetooth. For example, when various kinds of contents stored in the mobile terminal 20A are not playing on the on-vehicle AV device, or when the passenger is not talking hands-free via Bluetooth, it is determined that the communication load is light.

If the connection is refused by the mobile terminal 20A (the answer is NO in step S102), or if it is determined that the communication load between the on-vehicle information device 10 and the mobile terminal 20A is heavy (the answer is NO in step S114), the CPU 12 quits transmitting the vehicle information via the mobile terminal 20A, and switches the destination of the vehicle information to the other mobile terminal 20B. That is, the CPU 12 requests the mobile terminal 20B for connection (step S11). Receiving the request for connection, the mobile terminal 20B checks the communication environment setting to see the interior communications (see FIG. 3), and informs the on-vehicle information device 10 whether the connection is permitted or not (step S201). Subsequently, as in the case of the mobile terminal 20A, based on whether the connection to the mobile terminal 20B is permitted or not and the communication load between the on-vehicle information device 10 and the mobile terminal 20, the CPU 12 requests the mobile terminal 20B for file transfer if the mobile terminal 20B permits the connection and the communication load is light (proceeds to steps S12 and S22 in FIG. 4).

Alternatively, if the connection is refused by the mobile terminal 20B (the answer is NO in step S102), or if it is determined that the communication load between the on-vehicle information device 10 and the mobile terminal 20 is heavy (the answer is NO in step S114), the CPU 12 interrupts the file transfer process, and the on-vehicle information device 10 waits for the timing of file transfer (step S109). After a lapse of a predetermined time, or if a next trigger for the transmission of a file to the center device 30 is generated, the on-vehicle information device 10 requests the mobile terminal 20A for connection, and repeats the above-described procedure.

In the above-described procedure, check of the communication load between the on-vehicle information device 10 and the mobile terminal 20 (step S113) may be performed before requesting the mobile terminal 20 for connection (before step S11).

Third Example

Figure 7:
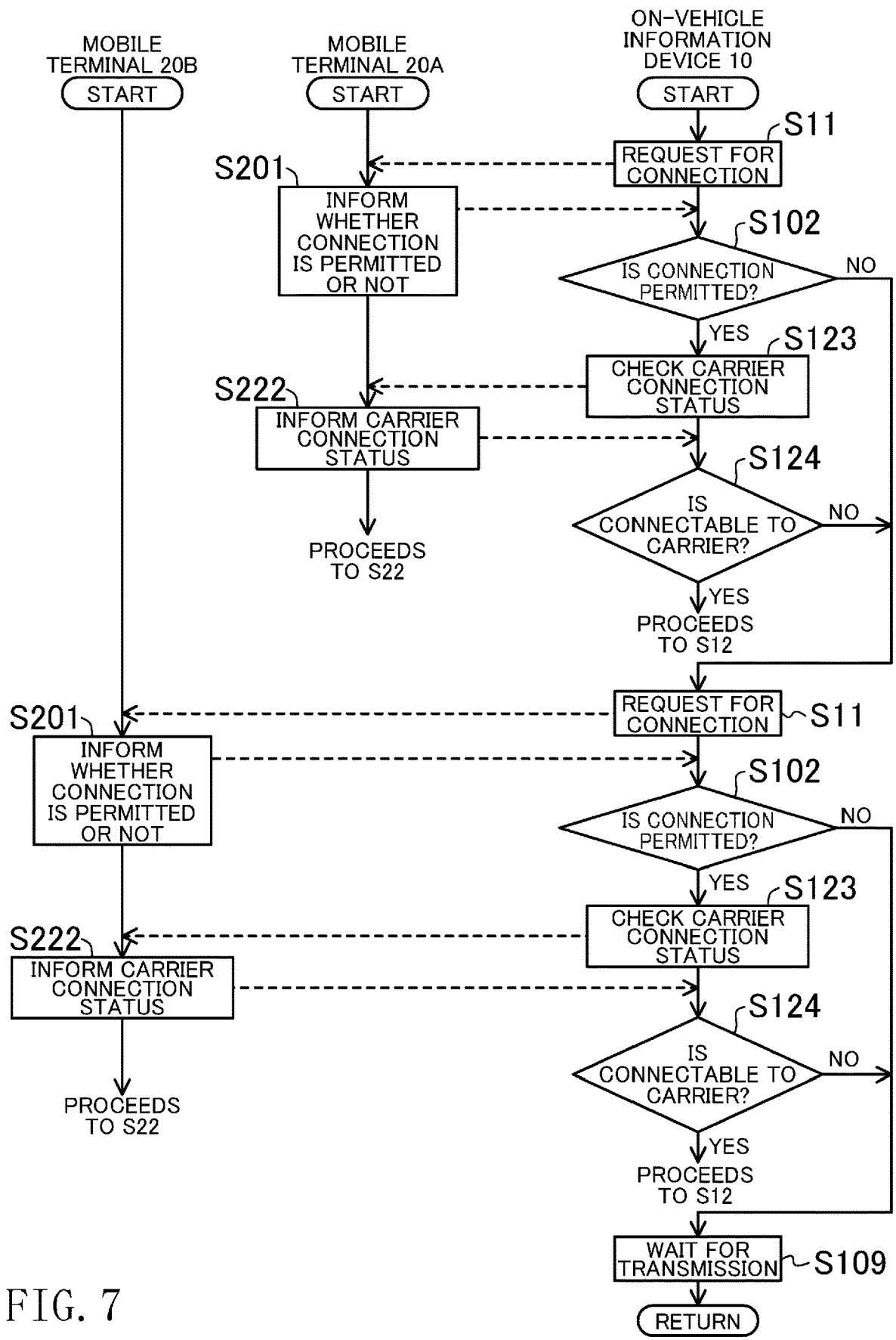
FIG. 7 illustrates still another exemplary flowchart of a vehicle information transmission process performed by the information communications system.

FIG. 7 shows still another exemplary flowchart of the vehicle information transmission process performed by the information communications system 100. Referring to FIG. 7, it will be described below still another example of the vehicle information transmission process performed by the information communications system 100. For convenience, it is assumed that two mobile terminals 20 are connected to the on-vehicle information device 10. In FIG. 7, reference numerals 20A and 20B are shown to distinguish the two mobile terminals 20 from each other.

If the on-vehicle information device 10 has generated a file containing the vehicle information and a trigger for transmitting the file to the center device 30 has been generated, the on-vehicle information device 10 requests the mobile terminal 20A, which is currently selected as a destination, for connection (step S11). Receiving the request for connection, the mobile terminal 20A checks the communication environment setting to see the interior communications (see FIG. 3), and informs the on-vehicle information device 10 whether the connection is permitted or not (step S201).

Receiving permission for connection from the mobile terminal 20A (if the answer is YES in step S102), the CPU 12 of the on-vehicle information device 10 checks a carrier connection status of the mobile terminal 20A (step S123). For example, the CPU 12 requests the mobile terminal 20A to notify the CPU 12 of the carrier connection status. Receiving the request for notification, the mobile terminal 20A checks the carrier connection status and notifies the on-vehicle information device 10 of it (step S222), and waits for the request for file transfer from the on-vehicle information device 10 (proceeds to step S22 in FIG. 4). The carrier connection status may be expressed, for example, as "connection available" or "no connection available."

Receiving the notification of the carrier connection status from the mobile terminal 20A, the CPU 12 determines whether the mobile terminal 20A is connectable to the carrier network or not. If the mobile terminal 20A is connectable (the answer is YES in step S124), the CPU 12 requests the mobile terminal 20A for file transfer (the process proceeds to step S12 in FIG. 4).

If the connection is refused by the mobile terminal 20A (the answer is NO in step S102), or if it is determined that the mobile terminal 20A is not connectable to the carrier network (the answer is NO in step S124), the CPU 12 quits transmitting the vehicle information via the mobile terminal 20A, and switches the destination of the vehicle information to the other mobile terminal 20B. That is, the CPU 12 requests the mobile terminal 20B for connection (step S11). Receiving the request for connection, the mobile terminal 20B checks the communication environment setting to see the interior communications (see FIG. 3), and informs the on-vehicle information device 10 whether the connection is permitted or not (step S201). Subsequently, as in the case of the mobile terminal 20A, based on whether the connection to the mobile terminal 20B is permitted or not and the carrier connection status of the mobile terminal 20B, the CPU 12 requests the mobile terminal 20B for file transfer if the mobile terminal 20B permits the connection and is connectable to the carrier network (the process proceeds to steps S12 and S22 in FIG. 4).

Alternatively, if the connection is refused by the mobile terminal 20B (the answer is NO in step S102), or if it is determined that the mobile terminal 20B is not connectable to the carrier network (the answer is NO in step S124), the CPU 12 interrupts the file transfer process, and the on-vehicle information device 10 waits for the timing of file transfer (step S109). After a lapse of a predetermined time, or if a next trigger for the transmission of a file to the center device 30 is generated, the on-vehicle information device 10 requests the mobile terminal 20A for connection, and repeats the above-described procedure.

In the above-described procedure, check of the carrier connection status of the mobile terminal 20 (step S123) may be performed before requesting the mobile terminal 20 for connection (before step S11).

As can be seen, embodiments have just been described as examples of the technique disclosed in the present application. The accompanying drawings and detailed description have been presented for that purpose.

The components illustrated on the accompanying drawings and described in the detailed description include not only essential components that need to be used to overcome the problem, but also other unessential components that do not have to be used to overcome the problem. Therefore, such unessential components should not be taken for essential ones, simply because such unessential components are illustrated in the drawings or mentioned in the detailed description.

As long as the embodiments have been described as examples of the technique disclosed in the present application, modifications, replacement, addition, or omission can be made in various ways on the embodiments within the range of the claims or equivalents to the claims.

DESCRIPTION OF REFERENCE CHARACTERS

100 Information Communications System for Vehicle
10 On-Vehicle Information Device
11 Information Collection Unit
12 CPU (Control Unit)
14A Communication Interface
14B Communication Interface
20 Mobile Terminal
30 Center Device
41 PCM (On-Vehicle Device)
42 TCM (On-Vehicle Device)
43 BCM (On-Vehicle Device)
44 DSC (On-Vehicle Device)

The invention claimed is:

1. An information communications system for a vehicle, the system comprising an on-vehicle information device, wherein
the on-vehicle information device includes:
a module which collects vehicle information from an on-vehicle device;
a plurality of communication interfaces connected to a plurality of mobile terminals having a communication function and being brought inside the vehicle; and
a controller which transfers the vehicle information collected by the module to any one of the plurality of mobile terminals via any one of the plurality of communication interfaces,
if communication load between a first mobile terminal of the plurality of mobile terminals currently selected as the destination of the vehicle information and the on-vehicle information device is heavier than a predetermined threshold, the controller switches the destination of the vehicle information to a second mobile terminal of the plurality of mobile terminals that is different from the first mobile terminal, the communication load being based on at least one of music and video content, and
the second mobile terminal which received the vehicle information transfers the vehicle information thus received to a center device.

2. The system of claim 1, wherein
if the first mobile terminal has a battery level lower than a predetermined value, the controller switches the destination of the vehicle information to a different mobile terminal.

3. The system of claim 2, wherein
if a communication environment setting of the first mobile terminal does not permit connection between the first mobile terminal and the on-vehicle information device, the controller switches the destination of the vehicle information to a different mobile terminal.

4. The system of claim 1, wherein
if the first mobile terminal is not connectable to a carrier network, the controller switches the destination of the vehicle information to a different mobile terminal.

5. The system of claim 4, wherein
if a communication environment setting of the first mobile terminal does not permit connection between the first mobile terminal and the on-vehicle information device, the controller switches the destination of the vehicle information to a different mobile terminal.

6. The system of claim 1, wherein
if a communication environment setting of the first mobile terminal does not permit connection between the first mobile terminal and the on-vehicle information device, the controller switches the destination of the vehicle information to a different mobile terminal.

7. The system of claim 1, wherein
the on-vehicle information device comprises a memory for temporarily storing a file including the vehicle information collected by the module,
the second mobile terminal which has received the file from the controller, transfers the file to the center device, and when the file has been successfully transferred to the center device, the second mobile terminal requests to delete the file to the controller, and
the controller deletes the file from the memory in receiving the request of deletion.

8. The system of claim 1, wherein
the center device is disposed outside the vehicle at a remote location.

9. An information communications system for a vehicle, the system comprising an on-vehicle information device, wherein
the on-vehicle information device includes:
a module which collects vehicle information from an on-vehicle device;
a plurality of communication interfaces connected to a plurality of mobile terminals having a communication function and being brought inside the vehicle; and
a controller which transfers the vehicle information collected by the module to any one of the plurality of mobile terminals via any one of the plurality of communication interfaces,
if a first mobile terminal of the plurality of mobile terminals currently selected as a destination of the vehicle information satisfies a predetermined condition, the controller switches the destination of the vehicle information to a second mobile terminal of the plurality of mobile terminals that is different from the first mobile terminal, the predetermined condition being based on at least one of music and video content, and
the second mobile terminal which received the vehicle information transfers the vehicle information thus received to a center device that is disposed outside the vehicle at a remote location.

10. The system of claim 9, wherein
if the first mobile terminal has a battery level lower than a predetermined value, the controller switches the destination of the vehicle information to a different mobile terminal.

11. The system of claim 10, wherein
if a communication environment setting of the first mobile terminal does not permit connection between the first mobile terminal and the on-vehicle information device, the controller switches the destination of the vehicle information to a different mobile terminal.

12. The system of claim 9, wherein
if the first mobile terminal is not connectable to a carrier network, the controller switches the destination of the vehicle information to a different mobile terminal.

13. The system of claim 12, wherein
if a communication environment setting of the first mobile terminal does not permit connection between the first mobile terminal and the on-vehicle information device, the controller switches the destination of the vehicle information to a different mobile terminal.

14. The system of claim 9, wherein
if a communication environment setting of the first mobile terminal does not permit connection between the first mobile terminal and the on-vehicle information device, the controller switches the destination of the vehicle information to a different mobile terminal.

15. The system of claim 9, wherein
the on-vehicle information device comprises a memory for temporarily storing a file including the vehicle information collected by the module,
the second mobile terminal which has received the file from the controller, transfers the file to the center device, and when the file has been successfully transferred to the center device, the second mobile terminal requests to delete the file to the controller, and
the controller deletes the file from the memory in receiving the request of deletion.

* * * * *